US008559149B2

(12) United States Patent
Wavering et al.

(10) Patent No.: US 8,559,149 B2
(45) Date of Patent: Oct. 15, 2013

(54) MODULAR PRIMARY DISTRIBUTION CONTACT BOARD

(75) Inventors: Jeffrey T. Wavering, Rockford, IL (US); Francis C. Belisle, Roscoe, IL (US); Josef Maier, Munningen (DE)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 1295 days.

(21) Appl. No.: 12/114,964

(22) Filed: May 5, 2008

(65) Prior Publication Data
US 2009/0273234 A1 Nov. 5, 2009

(51) Int. Cl.
*H02H 3/08* (2006.01)
*H05K 7/00* (2006.01)

(52) U.S. Cl.
USPC .......... 361/93.1; 361/93.5; 361/748; 361/752

(58) Field of Classification Search
USPC ................. 361/93.1, 93.5, 748, 752
See application file for complete search history.

(56) References Cited

U.S. PATENT DOCUMENTS

| | | | | |
|---|---|---|---|---|
| 3,323,086 A | * | 5/1967 | Pimentel | 335/202 |
| 4,104,581 A | * | 8/1978 | Arkosy | 324/523 |
| 4,389,608 A | * | 6/1983 | Dahl et al. | 320/137 |
| 4,715,822 A | | 12/1987 | Stribel | |
| 4,868,535 A | | 9/1989 | Janniere et al. | |
| 4,908,738 A | | 3/1990 | Kobari et al. | |
| 5,481,194 A | * | 1/1996 | Schantz et al. | 324/522 |
| 5,513,072 A | | 4/1996 | Imaji et al. | |
| 5,552,976 A | * | 9/1996 | Munro et al. | 363/39 |
| 5,567,991 A | * | 10/1996 | Schantz et al. | 307/10.1 |
| 5,581,130 A | * | 12/1996 | Boucheron | 307/10.1 |
| 5,594,285 A | | 1/1997 | Wisbey et al. | |
| 5,648,892 A | | 7/1997 | Wieloch et al. | |
| 5,760,587 A | * | 6/1998 | Harvey | 324/434 |
| 6,122,155 A | * | 9/2000 | Aromin et al. | 361/42 |
| 6,201,701 B1 | | 3/2001 | Linden et al. | |
| 6,421,253 B1 | | 7/2002 | Ash, Jr. | |
| 6,441,520 B1 | | 8/2002 | Grant | |
| D463,362 S | | 9/2002 | Alcantar et al. | |

(Continued)

FOREIGN PATENT DOCUMENTS

| | | |
|---|---|---|
| EP | 0495322 | 11/1995 |
| EP | 1 263 012 | 12/2002 |
| JP | 9-121089 | 5/1997 |

OTHER PUBLICATIONS

European Search Report for European Patent Application No. 09251257.3 completed Jan. 30, 2013.

*Primary Examiner* — Rexford Barnie
*Assistant Examiner* — Zeev V Kitov
(74) *Attorney, Agent, or Firm* — Carlson, Gaskey & Olds, P.C.

(57) ABSTRACT

An aircraft power distribution system is disclosed that includes a power distribution box. A generator supplies power to the power distribution box, and a load receives power from the power distribution box. The power distribution box includes a board supporting plug-in pins receiving the power. A contactor is supported by the board to selectively providing power to a secondary power distribution connector supported on the board. The board includes power traces that are run within the board to connect the plug-in pins to the secondary power distribution connector. Protection and secondary power distribution circuitry is also supported by the board and connected to the contactors and/or power traces by control traces. The power and control traces eliminate loose wiring and harnesses.

6 Claims, 2 Drawing Sheets

(56) References Cited

U.S. PATENT DOCUMENTS

| | | |
|---|---|---|
| 6,469,907 B1 | 10/2002 | Faveluke et al. |
| 6,470,224 B1 | 10/2002 | Drake et al. |
| 6,504,730 B1 | 1/2003 | Cooney et al. |
| 6,700,795 B1 * | 3/2004 | Jones et al. .................. 361/784 |
| 6,856,045 B1 | 2/2005 | Beneditz et al. |
| 7,102,356 B2 * | 9/2006 | Wild .............................. 324/510 |
| 7,342,762 B2 * | 3/2008 | Harris, IV .................... 361/103 |
| 7,978,446 B2 * | 7/2011 | Lindsey ......................... 361/42 |
| 2004/0113804 A1 | 6/2004 | Cabrera et al. |
| 2005/0216192 A1 | 9/2005 | Bringuel et al. |
| 2005/0230746 A1 | 10/2005 | Eden et al. |
| 2005/0265008 A1 | 12/2005 | Chamberlin et al. |
| 2007/0223160 A1 | 9/2007 | Coffey et al. |
| 2007/0297109 A9 * | 12/2007 | Borrego Bel et al. .......... 361/62 |

\* cited by examiner

MODULAR PRIMARY DISTRIBUTION CONTACT BOARD

BACKGROUND

This disclosure relates to a primary power distribution panel used in high current aircraft power distribution systems.

Traditional aircraft electric power systems have high power AC contactors to switch and protect power on the primary power distribution system. These contactors are individual line replaceable units that mount terminal posts or pads coming from the primary bus structure and are usually housed in a primary distribution panel that contains current-sensing features and sometimes control functions connected by numerous wires and that adds intelligence to open or close the contactors.

As electric power systems become more integrated, it is desirable to house the primary and secondary power distribution functions in a single enclosure. This is desirable since power from the primary distribution flows to the secondary relays and circuit breakers to be distributed to aircraft loads. However, such integration is problematic due to the amount of wiring and number of interconnects required to perform the functions of power control and protection. For example, it is difficult to gain access to buses that are segregated for safety. It is also difficult to keep that segregation through the secondary distribution with a minimum of cross-channel wiring. Moreover, the replacement of contactors has to be accommodated. Contactors typically use bolted joints, and hardware can be dropped or left untorqued when replacing the power joints.

What is needed is a primary power distribution panel having integrated power control and protection with segregated secondary power distribution and minimal wiring.

SUMMARY

An aircraft power distribution system is disclosed that includes a power distribution box. A generator supplies power to the power distribution box, and a load receives power from the power distribution box. The power distribution box includes a board supporting plug-in pins receiving the power. A contactor is supported by the board to selectively provide power to a secondary power distribution connector supported on the board. The board includes power traces within the board to connect the plug-in pins to the secondary power distribution connector. Protection and secondary power distribution circuitry are also supported by the board and connected to the contactors and/or power traces by control traces. The power and control traces eliminate loose wiring and harnesses.

These and other features of the disclosure can be best understood from the following specification and drawings, the following of which is a brief description.

DETAILED DESCRIPTION

Figure 1:
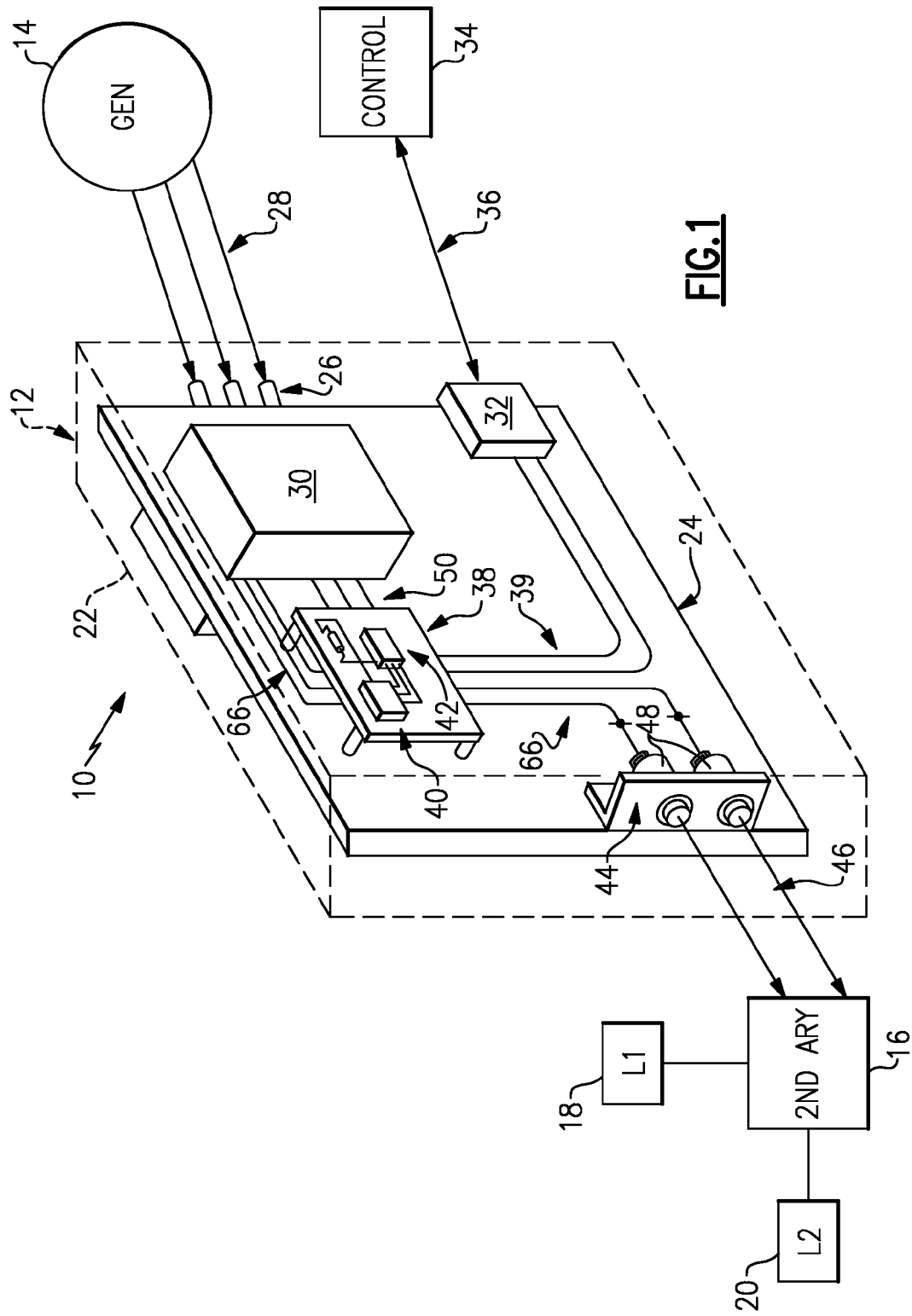
FIG. 1 is a schematic view of an aircraft power distribution system.

An aircraft power distribution system 10 is shown in FIG. 1. The system 10 includes a primary power distribution box 12 that receives power from a generator 14 through power leads 28. The primary power distribution box 12 provides power through supply leads 46 to a secondary power distribution box 16, which distributes power to first and second loads 18, 20, for example.

The primary power distribution box 12 includes a board 24 arranged within a housing 22. The board 24 supports plug-in pins 26 that are connected to the power leads 28. Mechanical contactors 30 act as switches to selectively electrically connect the power leads to the supply leads 46. In one example, the contactors 30 are permanently secured to the board 24 such that removal of the contactors 30 from the board 24 would result in damage to the contactors 30 and/or board 24. Circuit breakers 48 are supported by the board 24 to selectively disconnect the supply leads 46 from power in response to an overload. In one example, the circuit breakers 48 plug into the board to eliminate wiring.

The board 24 also supports a connector 32 that communicates with a control 34 through a harness 36. The control 34 provides commands to the board 24 and/or a secondary circuit board 38 and receives feedback regarding various functions related to the system 10. In one embodiment, the secondary circuit board 38 plugs into the board 24 to eliminate wiring. Printed traces are also run on or within the board 24 and secondary circuit board 38 to eliminate loose wiring and harnesses, which is described in more detail below. The components mounted to the board 24 connect to various traces on the board 24.

The secondary circuit board 38 is mounted on the board 24. The secondary circuit board 38 is connected to the connector 32 and contactors 30 through connections 39, which may be provided by electrical traces in (or on) the board 24 to eliminate wiring. The secondary circuit board 38 includes protection circuitry 40 and secondary power distribution circuitry 42. The protection circuitry 40 monitors the current provided by the generator 14, for example, to prevent the secondary power distribution box 16 from undesired currents. The secondary power distribution circuitry 42 commands the contactors 30 between open and closed positions.

Figure 2:
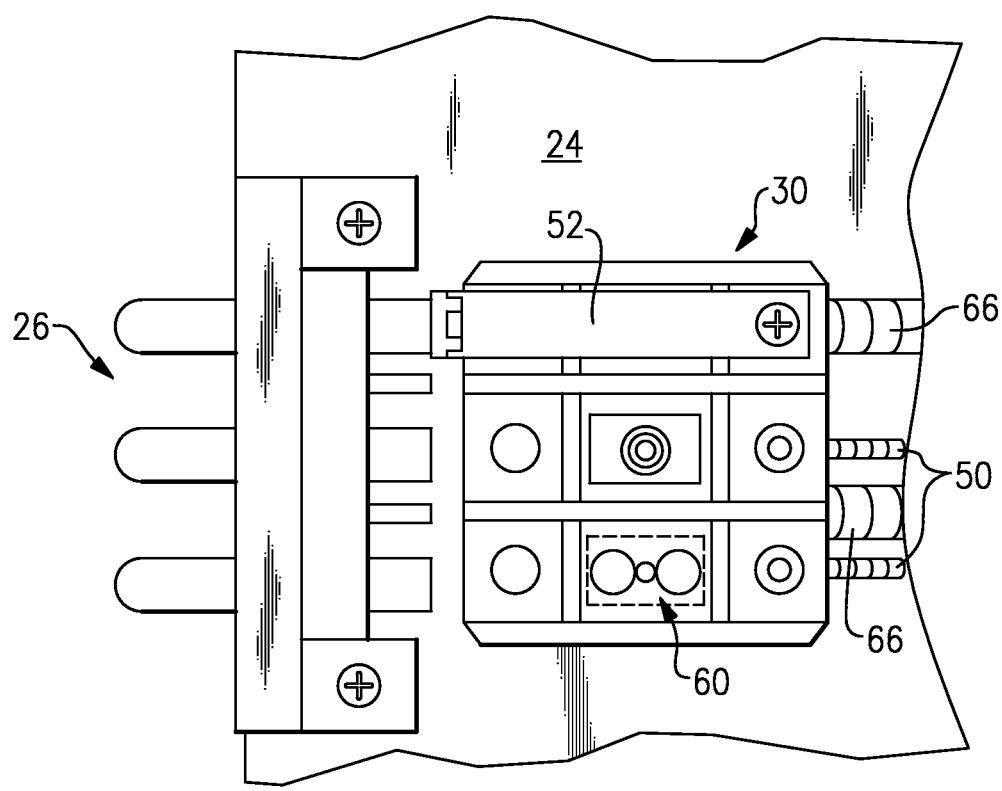
FIG. 2 is a top elevation view of a portion of a primary power distribution board shown in FIG. 1.
Figure 3:
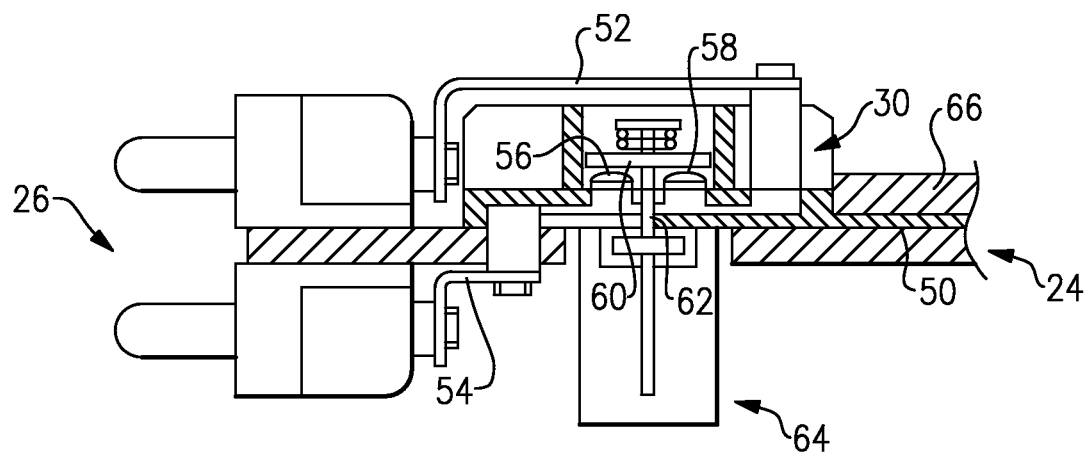
FIG. 3 is a sectional side elevation view of the primary power distribution board shown in FIG. 2.

Referring to FIGS. 2 and 3, the contactors 30 are illustrated with control traces 50 and power traces 66 (schematically shown) supported by the board 24 and connected to the secondary circuit board 38 and secondary power distribution connectors 44, respectively. The board 24 is relatively thick to accommodate the current flowing through the power traces 66. In the example shown, the contactors 30 are connected to the plug-in pins 26 by first and second bands 52, 54. The power traces 66 are selectively provided power when a plate 60 is in a closed position connecting first and second contacts 56, 58. The plate 60 is moved between open and closed positions by a plunger 62 in response to actuation of an actuator 64. In one example, the actuator 64 is a motor. The actuator 64, which is mounted to the board 24, is commanded by the secondary power distribution circuitry 42 through the control traces 50. The current flowing through the traces 66 is monitored by the protection circuitry 42 through the control traces 50.

Although exemplary embodiments have been disclosed, a worker of ordinary skill in this art would recognize that certain modifications would come within the scope of the claims. For that reason, the following claims should be studied to determine their true scope and content.

What is claimed is:

1. An aircraft power distribution system comprising:
a power distribution box;
a generator supplying power to the power distribution box;
a load receiving power from the power distribution box;

wherein the power distribution box includes a board supporting plug-in pins receiving power, a contactor supported by the board and configured to selectively provide power to a secondary power distribution connector supported on the board in response to a command, the board including power traces connecting the plug-in pins to the secondary power distribution connector;
a secondary circuit board supported by the board, the current-sensing circuitry mounted on the secondary circuit board; and
a current-sensing circuitry supported by the board and connected to at least one of the plug-in pins and the power traces, the current-sensing circuitry configured to monitor current to the power traces.

2. An aircraft power distribution system comprising:
a power distribution box;
a generator supplying power to the power distribution box;
a load receiving power from the power distribution box;
wherein the power distribution box includes a board supporting plug-in pins receiving power, a contactor supported by the board and configured to selectively provide power to a secondary power distribution connector supported on the board in response to a command, the board including power traces connecting the plug-in pins to the secondary power distribution connector; and
a secondary circuit board supported by the board, the secondary power distribution circuitry mounted on the secondary circuit board.

3. A power distribution panel comprising:
a board supporting plug-in pins receiving the power, a contactor supported by the board and configured to selectively provide power to a secondary power distribution connector supported on the board in response to a command, the board including power traces connecting the plug-in pins to the secondary power distribution connector;
current-sensing circuitry supported by the board and connected to at least one of the plug-in pins and the power traces, the current-sensing circuitry configured to monitor current to the power traces;
secondary power distribution circuitry supported by the board and configured to provide the command; and
a secondary circuit board supported by the board, the current-sensing circuitry mounted on the secondary circuit board.

4. A power distribution panel comprising:
a board supporting plug-in pins receiving the power, a contactor supported by the board and configured to selectively provide power to a secondary power distribution connector supported on the board in response to a command, the board including power traces connecting the plug-in pins to the secondary power distribution connector;
current-sensing circuitry supported by the board and connected to at least one of the plug-in pins and the power traces, the current-sensing circuitry configured to monitor current to the power traces;
secondary power distribution circuitry supported by the board and configured to provide the command; and
a secondary circuit board supported by the board, the secondary power distribution circuitry mounted on the secondary circuit board.

5. The system according to claim 2, comprising secondary power distribution circuitry supported by the board and configured to provide the command, and a connector supported on the board and in communication with a control remote from the board, the connector in communication with the secondary power distribution circuitry, and the control configured to send the command.

6. The system according to claim 4, comprising a connector supported on the board and configured to communicate with a control remote from the board, the connector in communication with the secondary power distribution circuitry.

* * * * *